US009952111B2

(12) United States Patent
Froemel

(10) Patent No.: US 9,952,111 B2
(45) Date of Patent: Apr. 24, 2018

(54) SYSTEM AND METHOD FOR A PACKAGED MEMS DEVICE

(71) Applicant: Infineon Technologies AG, Neubiberg (DE)

(72) Inventor: Andreas Froemel, Kirchseeon (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 278 days.

(21) Appl. No.: 14/687,276

(22) Filed: Apr. 15, 2015

(65) Prior Publication Data
US 2016/0305837 A1 Oct. 20, 2016

(51) Int. Cl.
G01L 9/12 (2006.01)
G01L 9/00 (2006.01)
B81B 7/00 (2006.01)

(52) U.S. Cl.
CPC .......... G01L 9/0073 (2013.01); B81B 7/0061 (2013.01); G01L 9/0041 (2013.01); B81B 2201/0257 (2013.01); B81B 2201/0264 (2013.01); B81B 2207/012 (2013.01); B81C 2203/0109 (2013.01)

(58) Field of Classification Search
None
See application file for complete search history.

(56) References Cited

U.S. PATENT DOCUMENTS

| | | | |
|---|---|---|---|
| 6,730,989 B1 | 5/2004 | Reithinger et al. | |
| 6,807,064 B2 | 10/2004 | Hedler et al. | |
| 6,852,931 B2 | 2/2005 | Hedler et al. | |
| 7,393,712 B2* | 7/2008 | Smith | B81B 7/0061 257/E21.502 |
| 7,420,817 B2* | 9/2008 | Eskridge | B81B 7/007 174/541 |
| 7,851,925 B2 | 12/2010 | Theuss et al. | |
| 8,217,474 B2* | 7/2012 | Lee | B81C 1/00246 257/254 |
| 8,428,286 B2 | 4/2013 | Fueldner et al. | |
| 8,497,558 B2 | 7/2013 | Krumbein et al. | |
| 8,618,620 B2 | 12/2013 | Winkler et al. | |
| 8,906,747 B2* | 12/2014 | Hooper | B81B 7/0064 257/678 |
| 9,162,872 B2* | 10/2015 | Goida | B81B 7/0032 |
| 9,238,579 B2* | 1/2016 | Ochs | B81B 7/0077 |
| 9,321,626 B2* | 4/2016 | Shaw | H01L 29/84 |
| 2006/0076632 A1 | 4/2006 | Palmateer et al. | |

(Continued)

FOREIGN PATENT DOCUMENTS

| | | |
|---|---|---|
| CN | 103313172 A | 9/2013 |
| KR | 20060092899 A | 8/2006 |
| KR | 20110054529 A | 5/2011 |

OTHER PUBLICATIONS

Bosch, "BMP085 Digital Pressure Sensor Data Sheet," Document No. BST-BMP085-DS000-05, Released Oct. 15, 2009, 27 pages.

*Primary Examiner* — Peter Macchiarolo
*Assistant Examiner* — Jermaine Jenkins
(74) *Attorney, Agent, or Firm* — Slater Matsil, LLP

(57) ABSTRACT

According to an embodiment, a device includes a substrate, a transducer die disposed over the substrate, a cover disposed over the transducer die, and a support structure connecting the cover to the substrate. The support structure includes a port configured to allow transfer of fluidic signals between an ambient environment and the transducer die.

23 Claims, 7 Drawing Sheets

(56) References Cited

U.S. PATENT DOCUMENTS

2011/0272769 A1 11/2011 Song et al.
2013/0277776 A1 10/2013 Herzum et al.
2014/0070382 A1 3/2014 Goida
2015/0001645 A1 1/2015 Faralli et al.

\* cited by examiner

SYSTEM AND METHOD FOR A PACKAGED MEMS DEVICE

TECHNICAL FIELD

The present invention relates generally to transducers and packaging, and, in particular embodiments, to a system and method for a packaged microelectromechanical systems (MEMS) device.

BACKGROUND

Transducers that convert signals from one domain to another are often used in sensors. A common sensor that includes a transducer is a pressure sensor that converts pressure differences and/or pressure changes to electrical signals. Pressure sensors have numerous applications including, for example, atmospheric pressure sensing, altitude sensing, and weather monitoring.

Microelectromechanical system (MEMS) based sensors include a family of transducers produced using micromachining techniques. MEMS, such as a MEMS pressure sensor, gather information from the environment by measuring the change of physical state in the transducer and transferring the signal to be processed by the electronics, which are connected to the MEMS sensor. MEMS devices may be manufactured using micromachining fabrication techniques similar to those used for integrated circuits.

MEMS devices may be designed to function as oscillators, resonators, accelerometers, gyroscopes, pressure sensors, microphones, and/or micro-mirrors, for example. Many MEMS devices use capacitive sensing techniques for transducing the physical phenomenon into electrical signals. In such applications, the capacitance change in the sensor is converted to a voltage signal using interface circuits.

A pressure sensor may also be implemented as a capacitive MEMS device that includes a reference volume and a deflectable membrane. A pressure difference between the reference volume and an external volume, such as the ambient environment in some cases, causes the membrane to deflect. Generally, the deflection of the membrane causes a change in distance between the membrane and a sensing electrode, thereby changing the capacitance. Thus, a pressure sensor measures a pressure difference between the reference volume and an external pressure.

For transducers that interact with an external environment outside the device, such as a pressure sensor, an opening or coupling to the external environment is usually included in the device structure. For example, microphones generally include a sound port and pressure sensors generally include a similar air pressure port. When the device is packaged, such openings or couplings may provide a way for contaminants such as dirt or particles to affect transducers that include such openings.

SUMMARY

According to an embodiment, a device includes a substrate, a transducer die disposed over the substrate, a cover disposed over the transducer die, and a support structure connecting the cover to the substrate. The support structure includes a port configured to allow transfer of fluidic signals between an ambient environment and the transducer die.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely MEMS transducers, and more particularly, MEMS pressure sensors. Some of the various embodiments described herein include MEMS transducer systems, MEMS pressure sensors, packaging methods for MEMS transducers and interface electronics, and packaged MEMS pressure sensors. In other embodiments, aspects may also be applied to other applications involving any type of transducer or package according to any fashion as known in the art.

According to various embodiments, a MEMS pressure sensor is used to sense the pressure of an ambient environment. The MEMS pressure sensor is included in a packaged MEMS device that includes a circuit board, an integrated circuit (IC) disposed on the circuit board, a MEMS pressure sensor disposed on the IC, and a cover disposed over the MEMS pressure sensor and attached to the circuit board through an attachment structure disposed between the circuit board and the cover.

In various embodiments, an environmental port is formed by structuring the attachment structure to form openings between the circuit board and the cover. In particular embodiments, the openings formed in the attachment structure have a height of about 35 μm. The environmental port allows transmission of fluidic signals between the ambient environment outside the cover and the MEMS pressure sensor inside the cover. In some embodiments, the placement of the openings in the attachment structure may increase the protection provided to the MEMS pressure sensor by preventing particles such as dirt from contacting the MEMS pressure sensor while transmitting fluidic signals, such as pressure changes in the air, through the openings to the MEMS pressure sensor. In various embodiments, other types of environmental MEMS transducers may be included in the packaged MEMS device such that the MEMS pressure sensor is packaged with or replaced by another type of MEMS sensor. For example, a MEMS microphone may be included in the packaged MEMS device in some embodiments.

Figure 1:
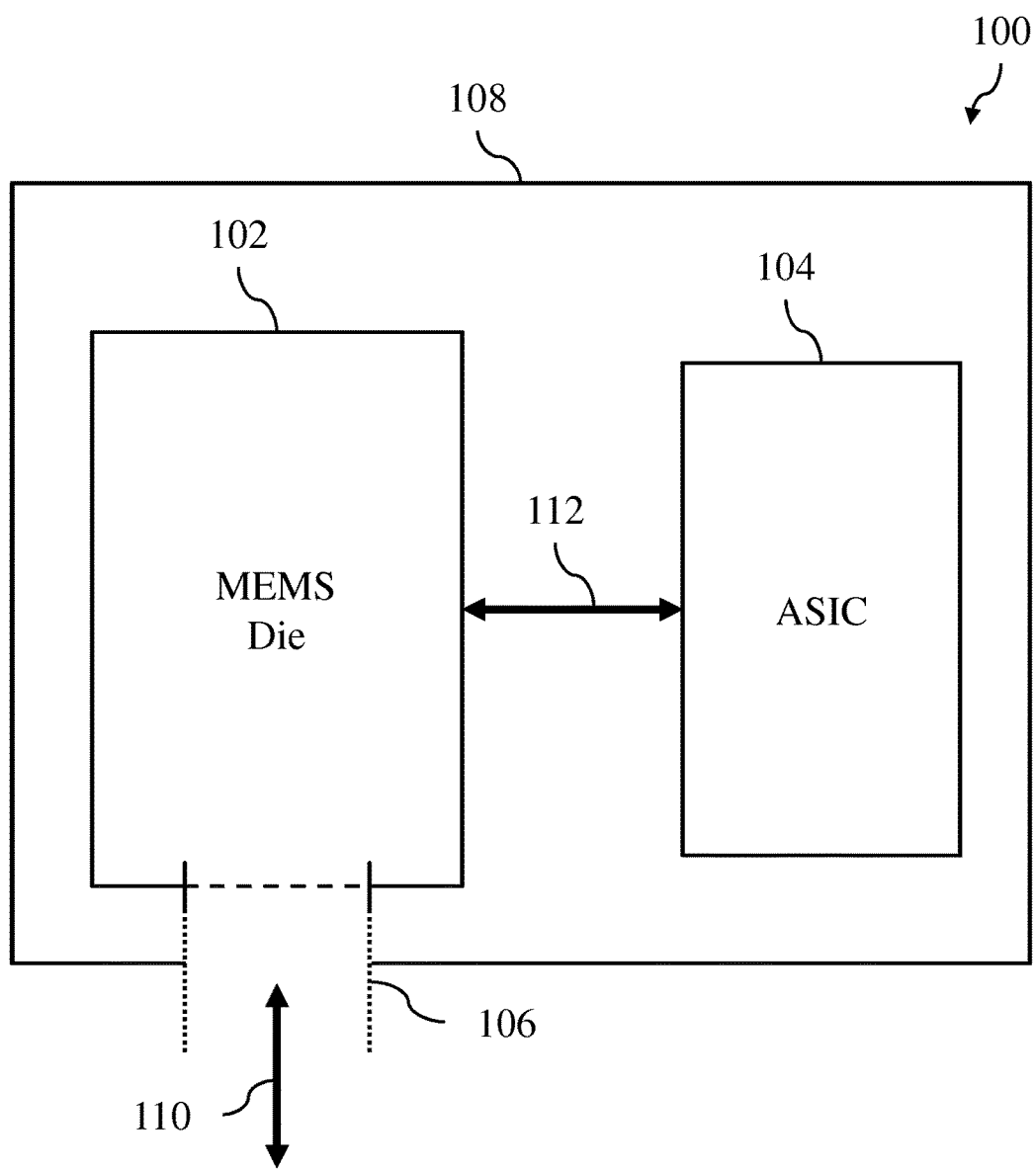
FIG. 1 illustrates a system block diagram of an embodiment packaged MEMS device.

FIG. 1 illustrates a system block diagram of an embodiment packaged MEMS device 100 including MEMS die 102 and application specific integrated circuit (ASIC) 104 inside package 108. According to various embodiments, MEMS die 102 is coupled to ASIC 104 through electrical coupling 112. MEMS die 102 is also coupled to an ambient environment outside of package 108 through fluidic coupling 110, which is provided through port 106 in package 108. Based on fluidic signals received via fluidic coupling 110 in port 106, MEMS die 102 generates transduced electrical signals and transmits the transduced electrical signals to ASIC 104 through electrical coupling 112.

In some embodiments, MEMS die 102 includes a pressure transducer coupled through port 106 to the ambient environment of packaged MEMS device 100. The pressure transducer may include first and second sense plates, for example. In some embodiments, the pressure sensor in MEMS die 102 includes a perforated rigid backplate and a deflectable membrane. Pressure changes in the ambient environment enter MEMS die 102 as fluidic signals through port 106 and cause the deflectable membrane to displace. The displacement changes the separation distance between the membrane and the backplate and generates a transduced pressure signal, which is supplied to ASIC 104. In other embodiments, MEMS die 102 may include any kind of transducer for sensing fluidic signals. For example, in some embodiments, a microphone may be implemented. In further embodiments, the sensing mechanism may be non-capacitive such as, e.g., optical or piezoelectric. In still other embodiments, the MEMS die 102 includes a membrane based speaker, such as a MEMS micro speaker.

In various embodiments, package 108 is implemented as a cover for MEMS die 102 and ASIC 104. In some specific embodiments, the cover may be metal or plastic and may be attached to a printed circuit board (PCB). In various embodiments, port 106 in package 108 allows transfer of fluidic signals such as the transfer of gases, liquids, acoustic signals in a fluidic medium, or pressure signals in a fluidic medium. In some embodiments, port 106 may be gas permeable, allowing the transfer of air and pressure or acoustic signals in the air, for example. In more specific embodiments, port 106 may also be liquid impermeable, preventing the transfer of water to MEMS die 102 in order to implement waterproofing. As another example, port 106 may allow transfer of temperature signals from the ambient environment through a fluidic medium, such as through air, in some embodiments.

In various embodiments, electrical coupling 112 may include multiple couplings. For example, ASIC 104 may provide a supply signal or bias voltage BIAS to MEMS die 102 in addition to the transduced electrical signals. ASIC 104 may be any type of integrated circuit in some embodiments.

In various embodiments, MEMS die 102 is formed as a single semiconductor die. Further, ASIC 104 may be formed as an integrated circuit on an additional semiconductor die. Package 108 may include a PCB with MEMS die 102 and ASIC 104 attached thereto. In other embodiments, ASIC 104 and MEMS die 102 may be integrated on a same substrate or a same semiconductor die. In the various embodiments, MEMS die 102 and ASIC 104 may be formed on a substrate that is a material other than a semiconductor, such as conductors or insulators, for example, or polymers in more specific examples. In some embodiments, ASIC 104 and MEMS die 102 are attached directly together in package 108, such as by flip chip bonding or wafer bonding.

As described further herein below, embodiment packaged MEMS devices include a port or ports formed in an attachment structure or attachment pads that are included as a portion of the package. In various embodiments, the placement of the port or ports in the attachment pads or the support structure may prevent contamination or damage to the MEMS die inside the package while allowing the transfer of fluidic signals or other environmental signals.

Figure 2A:
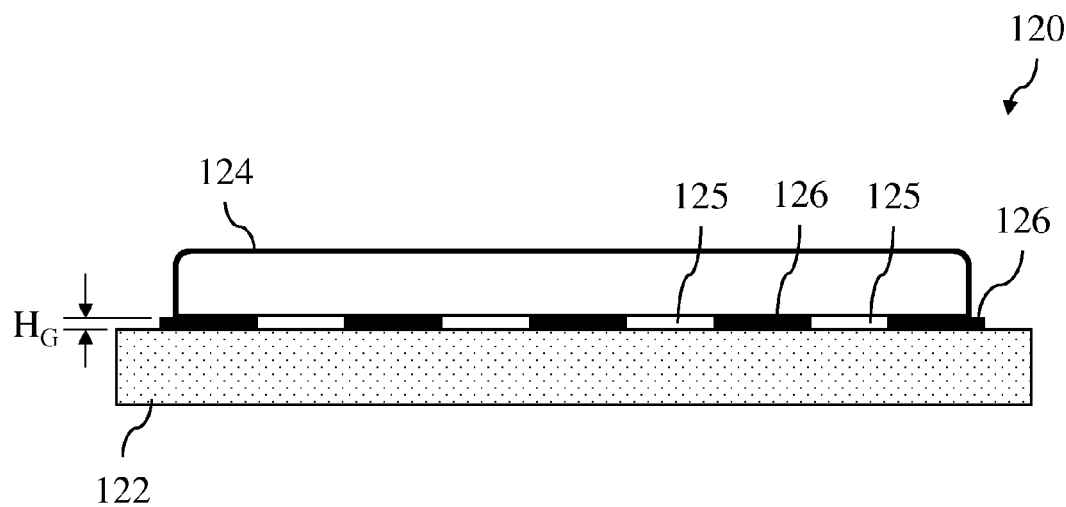
FIGS. 2a and 2b illustrate a schematic side view and a schematic top view of an embodiment packaged MEMS device.
Figure 2B:
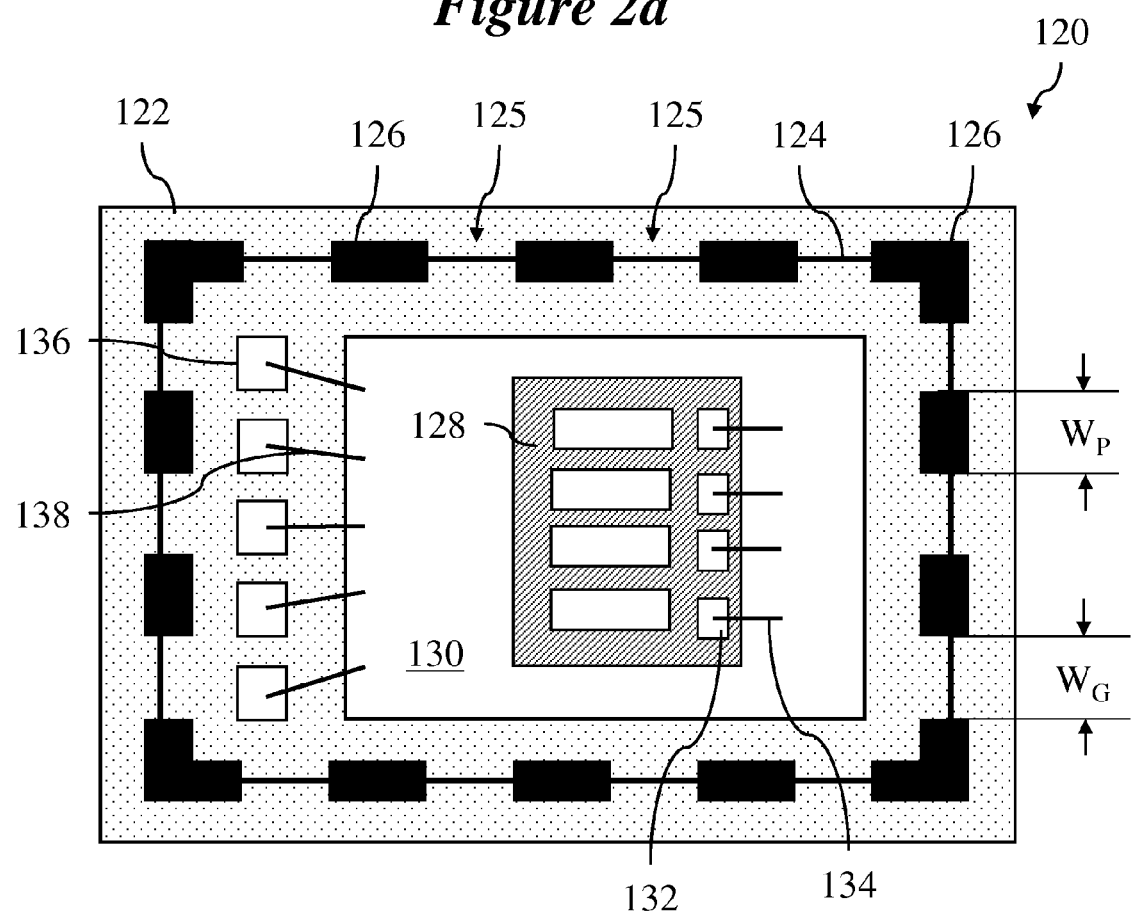

FIGS. 2a and 2b illustrate a schematic side view and a schematic top view of an embodiment packaged MEMS device 120 including PCB 122, cover 124, attachment pads 126, MEMS die 128, and ASIC 130. According to various embodiments, MEMS die 128 is implemented as a MEMS pressure sensor that measures the absolute pressure or pressure changes of an ambient environment outside of cover 124. In various embodiments, attachment pads 126 attach cover 124 to PCB 122 and also form gaps 125 between attachment pads 126. Gaps 125 provide ports or openings through which signals from the ambient environment may transfer to MEMS die 128. In such embodiments, gaps 125 may be referred to as environmental or fluidic ports that allow the transfer of fluidic signals, where fluidic signals include transport of liquids and gases as well as signals propagating through such fluidic mediums, such as pressure signals or acoustic signals. In some embodiments, gaps 125 may be gas permeable and liquid impermeable such as, for example, when waterproofing is applied. FIG. 2b illustrates an edge of cover 124 in contact with attachment pads 126, but cover 124 is otherwise illustrated as a see-through structure in order to show elements of packaged MEMS device 120, which would otherwise be hidden from view by cover 124.

In various embodiments, gaps 125 have a gap height HG, which is set by the height of attachment pads 126, and a gap width WG. Similarly, attachment pads 126 have a pad width WP. In various embodiments, the gap height HG may be less than 100 µm. In one particular embodiment, the gap height HG is about 35 µm. In alternative embodiments, the gap height HG may be larger than 100 µm. Further, the gap width WG may range from 10 µm to 10 mm in some embodiments. In other embodiments, the gap width WG may be outside this range. In various embodiments, setting the gap height HG and the gap width WG in addition to the number of gaps 125 adjusts the frequency response of the cavity inside cover 124. For example, larger openings, set by larger gap height HG and gap width WG, and a greater number of openings increases the high frequency limit of signals that may be sensed. Conversely, smaller openings or a lesser number of openings decreases the high frequency limit of signals that may be sensed. Thus, the configuration of gaps 125 may act as a low pass filter (LPF) for fluidic signals, such as pressure changes or acoustic signals.

As a further example, pressure changes in the ambient environment may occur with a frequency below about 10 Hz while acoustic signals may occur with a frequency range from about 100 Hz to about 22 kHz. In a specific embodiment where MEMS die 128 is implemented as a MEMS pressure sensor, gaps 125 may be configured with openings and in number such that gaps 125 operate as an LPF with a cutoff frequency of 10 Hz. In other embodiments, MEMS die 128 may be implemented as a MEMS microphone and gaps 125 may be configured with openings and in number such that gaps 125 operate as an LPF with a cutoff frequency of 22 kHz. In various further embodiments, gaps 125 may be configured to operate as an LPF with a cutoff frequency ranging from 1 Hz to 100 kHz, for example, depending on various sensor types and applications for MEMS die 128.

In various embodiments, gaps 125 may be evenly distributed around the circumference of cover 124 with even spacing provided by attachment pads 126. In other embodiments, gaps 125 may be unevenly distributed and include one or more gaps. For example, gaps 125 may be located only along and below one edge of cover 124 with the other three edges including a continuous attachment pad 126. In specific embodiments, gaps 125 may be limited to one, two, or three of the edges along and below cover 124.

According to various embodiments, ASIC 130 is attached to PCB 122 and coupled to contact pads 136 through wire bonds 138. MEMS die 128 may be stacked on ASIC 130 and electrically coupled to ASIC 130 through wire bonds 134 coupled to contact pads 132. In other embodiments, MEMS die 128 may be coupled to ASIC 130 through flip-chip bonding.

In specific embodiments, PCB 122 may be formed of various circuit board materials including but not limited to laminates, copper-clad laminates, resin impregnated cloth, and copper foil. Cover 124 may be a metal cover. In some specific embodiments, cover 124 is copper, steel, or aluminum. In alternative embodiments, cover 124 is formed of a polymer or glass. In some embodiments, attachment pads 126 are formed of a metal. Specifically, attachment pads 126 are formed of gold or copper in some specific embodiments. In other embodiments, attachment pads 126 are formed of lacquer or paint. In still further embodiments, attachment pads 126 attach cover 124 to PCB 122 using glue or resin. In another embodiment, attachment pads 126 attach cover 124 to PCB 122 by welding. In a specific embodiment, attachment pads 126 attach cover 124 to PCB 122 by soldering.

Figure 3A:
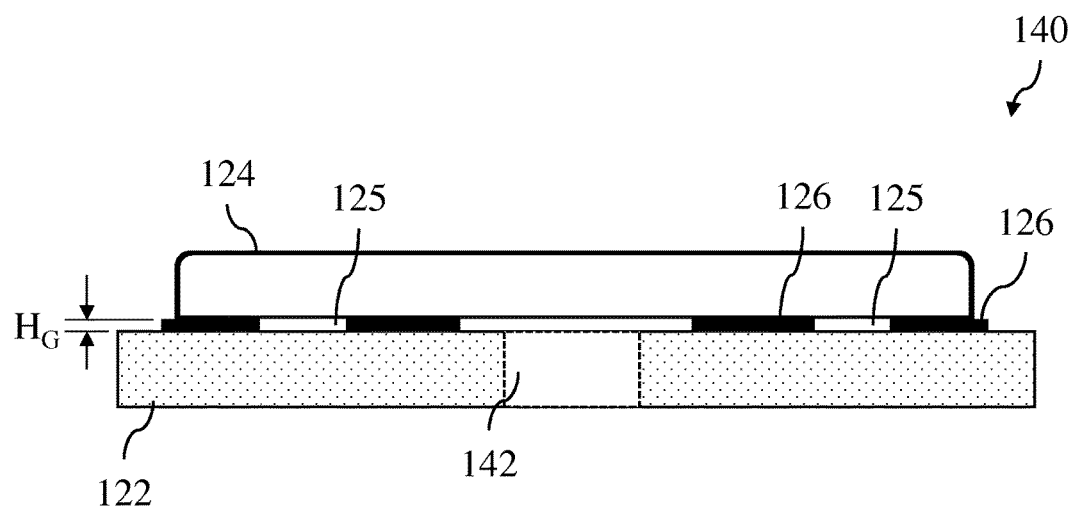
FIGS. 3a and 3b illustrate a schematic side view and a schematic top view of another embodiment packaged MEMS device.
Figure 3B:
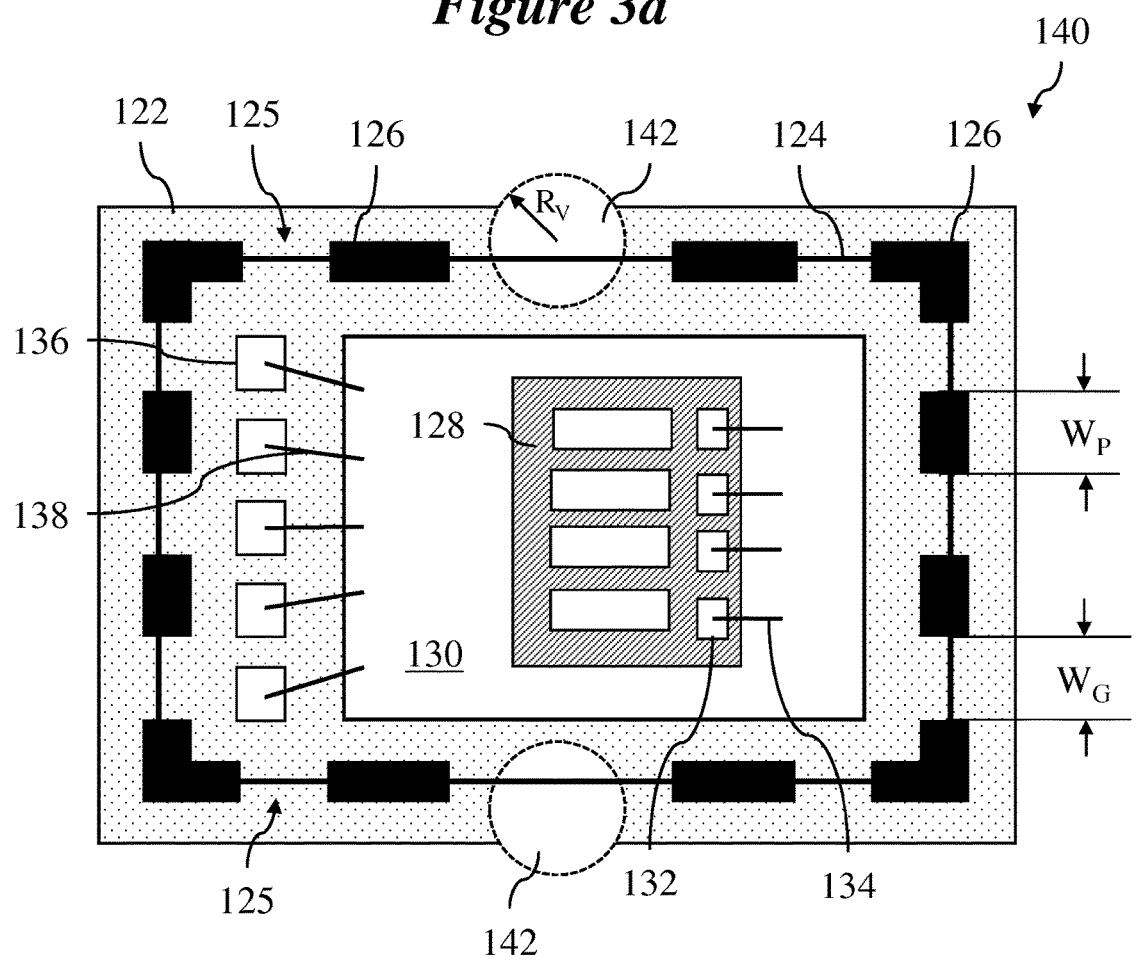

FIGS. 3a and 3b illustrate a schematic side view and a schematic top view of another embodiment packaged MEMS device 140 including PCB 122 with ventilation holes 142, cover 124, attachment pads 126, MEMS die 128, and ASIC 130. According to various embodiments, packaged MEMS device 140 operates as similarly described hereinabove in reference to packaged MEMS device 120 in FIGS. 2a and 2b with the addition of ventilation holes 142. In various embodiments, ventilation holes 142 are formed as holes in PCB 122 and increase airflow from the ambient environment to MEMS die 128 inside cover 124. Ventilation holes 142 may be formed below cover 124. In a specific embodiment, at least one ventilation hole of ventilation holes 142 is formed below an edge of cover 124 and extending beyond both sides of the edge of cover 124. In some embodiments, PCB 122 includes two ventilation holes 142. In one embodiment, PCB 122 includes only one ventilation hole 142. In further embodiments, PCB 122 includes three or more ventilation holes 142.

According to various embodiments, ventilation holes 142 have a ventilation radius RV. In some specific embodiments, the ventilation radius RV may range from 0.5 mm to 2 mm. In alternative embodiments, the ventilation radius RV may be outside this range. According to various embodiments, ventilation holes 142 pass completely through PCB 122. In other embodiments, ventilation holes 142 pass only partially through PCB 122 and do not form an opening through the bottom side, opposite to cover 124, of PCB 122.

Figure 4A:
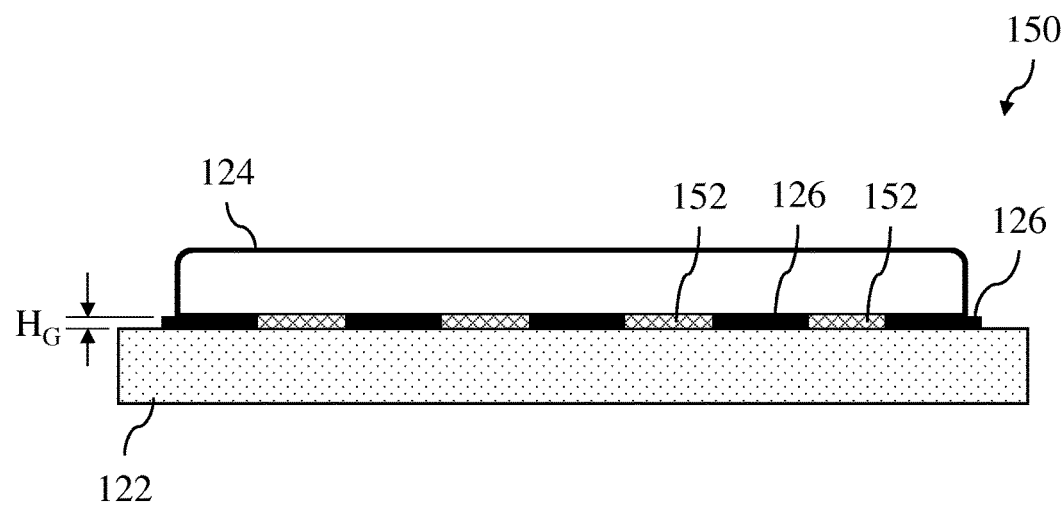
FIGS. 4a and 4b illustrate a schematic side view and a schematic top view of a further embodiment packaged MEMS device.
Figure 4B:
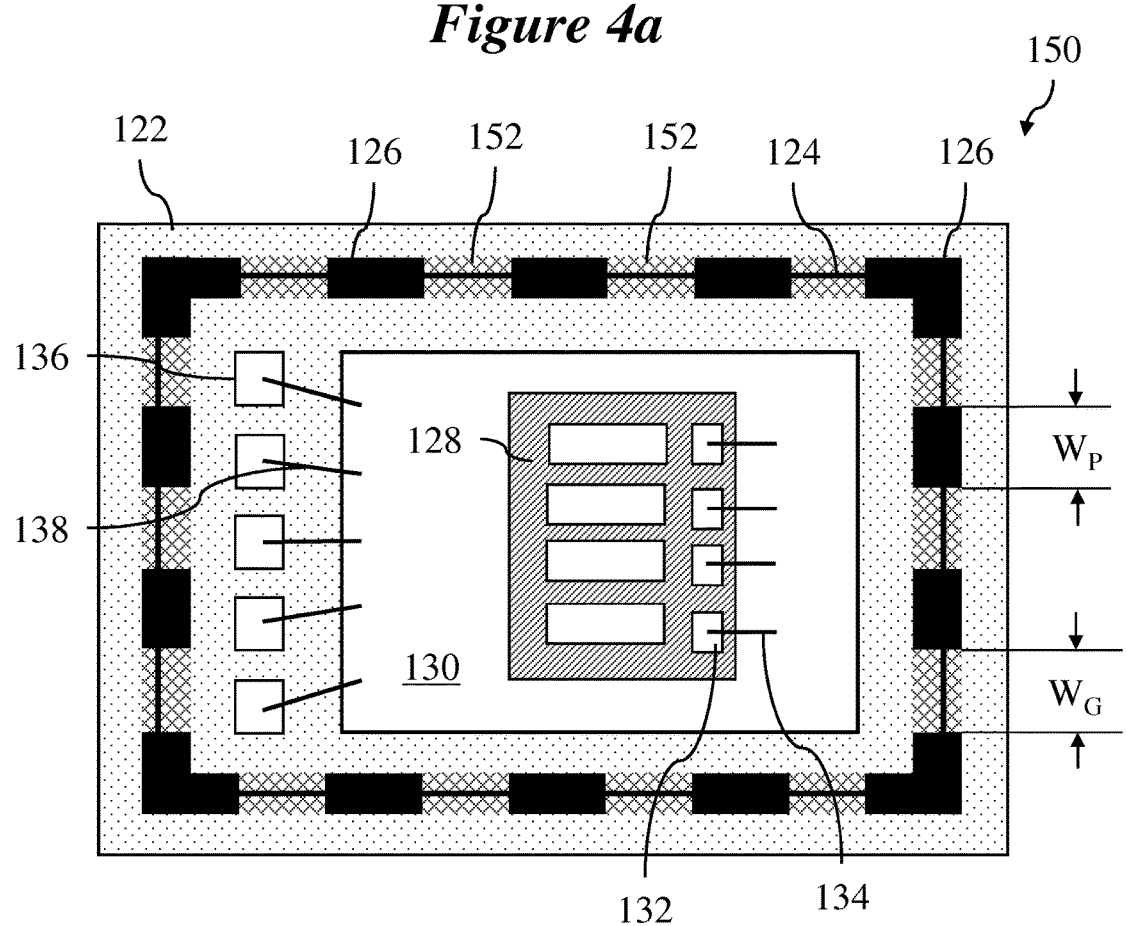

FIGS. 4a and 4b illustrate a schematic side view and a schematic top view of a further embodiment packaged MEMS device 150 including PCB 122, cover 124, attachment pads 126, MEMS die 128, and ASIC 130. According to various embodiments, packaged MEMS device 150 operates as similarly described hereinabove in reference to packaged MEMS device 120 in FIGS. 2a and 2b with the addition of mesh pads 152 in place of gaps 125. In various embodiments, mesh pads 152 are formed between attachment pads 126. Mesh pads 152 are formed of a gas permeable and liquid impermeable material. In specific embodiments, mesh pads 152 are permeable to air and impermeable to water, thus implementing waterproofing. In such example embodiments, mesh pads 152 may be formed of a gas permeable polymer or polymer resin. For example, mesh pad 152 may be formed of a non-porous polymer. In a further embodiment, mesh pads 152 may replace attachment pads 126 and form a continuous attachment structure along the entire edge of cover 124 that implements a gas permeable and liquid impermeable structure between cover 124 and PCB 122.

Figure 5:
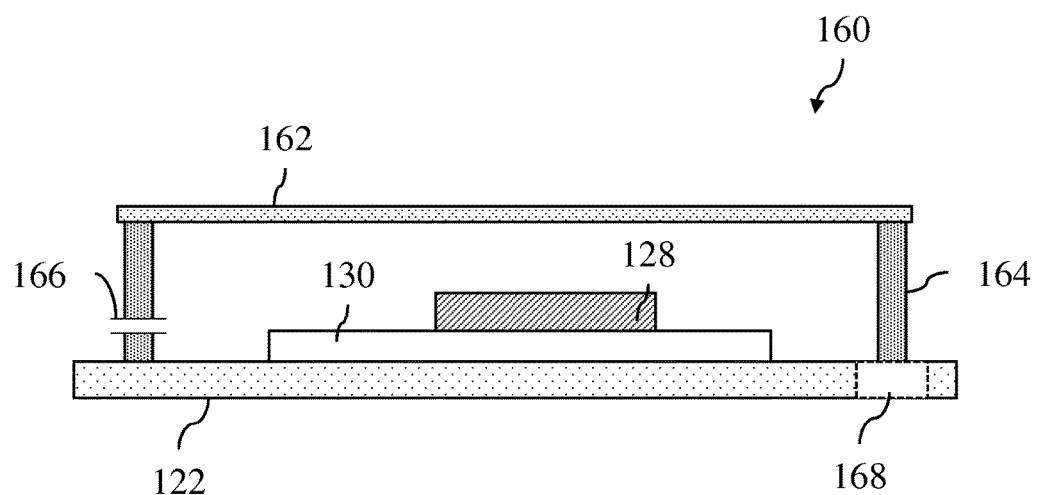
FIG. 5 illustrates a schematic side view cross-section of still another embodiment packaged MEMS device.

FIG. 5 illustrates a schematic side view cross-section of still another embodiment packaged MEMS device 160 including PCB 122, ASIC 130, MEMS die 128, and lid 162 supported by support structure 164. According to various embodiments, support structure 164 includes port 166 for providing fluidic coupling between the ambient environment and MEMS die 128. The elements of packaged MEMS device 160 are similar to the elements described in reference to packaged MEMS devices 120, 140, and 150, with support structure 164 and lid 162 replacing cover 124 and attachment pads 126.

In various embodiments, support structure 164 is disposed on PCB 122 and allows transfer of fluidic signals through port 166. Port 166 may include multiple openings or only a single opening. In such embodiments, the opening or openings that form port 166 may have various shapes or structures and may include empty openings or materials filling the openings. Lid 162 is connected though support structure 164 to PCB 122. In one embodiment, support structure 164 and lid 162 are separate structures assembled and coupled together in a fabrication sequence. Support structure 164 and lid 162 are formed of a metal, such as copper, aluminum, or gold, in some embodiments. In other embodiments, support structure 164 and lid 162 are formed of a polymer. In a still further embodiment, support structure 164 and lid 162 are formed of a semiconductor. In one alternative embodiment, support structure 164 and lid 162 are formed of glass. In some embodiments, lid 162 and support structure 164 are formed of a same material. In other embodiments, lid 162 and support structure 164 are formed of different materials.

In further embodiments, MEMS device 160 may also include ventilation hole 168 in PCB 122 beneath support structure 164. Ventilation hole 168 may be included as a through hole in PCB 122 or as only a partial hole in PCB 122 that does not pass all the way through PCB 122. In various embodiments, any number of ventilation holes 168 may be formed in PCB 122 below support structure 164. For example, description hereinabove of ventilation holes 142 in reference to FIGS. 3a and 3b may be applied to ventilation hole 168. In some alternative embodiments, ventilation hole 168 in PCB 122 is formed instead of port 166 in support structure 164.

Figure 6:
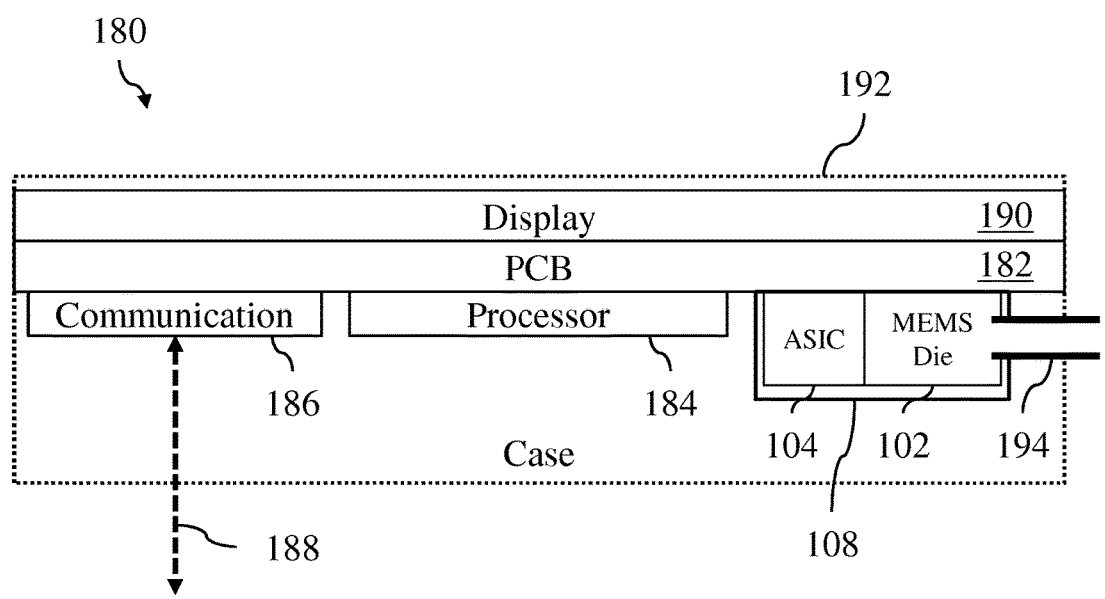
FIG. 6 illustrates a system block diagram of an embodiment electronic system.

FIG. 6 illustrates a system block diagram of an embodiment electronic system 180 including MEMS die 102 and ASIC 104 in package 108, processor 184, and communication circuit 186. According to various embodiments, electronic system 180 may be a mobile electronic device, such as a tablet computer or a mobile phone. MEMS die 102 functions as similarly described hereinabove in reference to MEMS die 102. For example, MEMS die 102 includes a MEMS pressure transducer coupled to the ambient environment through port 194, which provides fluidic coupling 110 described in reference to FIG. 1. MEMS die 102 is also coupled to ASIC 104, which may function as described hereinabove in reference to FIG. 1. In alternative embodiments, ASIC 104 is also integrated on MEMS die 102.

In various embodiments, package 108, including MEMS die 102 and ASIC 104, is coupled to PCB 182 and contained inside case 192. For example, case 192 may be the body of a tablet computer or a mobile phone. Display 190 may also be coupled to PCB 182. In some embodiments, processor 184 and communication circuit 186 are coupled to PCB 182. Communication circuit 186 communicates through communication pathway 188, which is a wireless communication pathway. In an alternative embodiment, communication pathway 188 is a wired connection.

In various embodiments, MEMS die 102 generates transduced electrical signals based on pressure signals from the ambient environment outside case 192 and provides the generated electrical signals through ASIC 104 and PCB 182 to processor 184. In alternative embodiments, electronic system 180 is a wired device, such as a workstation, personal computer, or a computing system for a specific application, such as industrial, medical, or aerospace application, for example, and communication pathway 188 may be a wired or wireless communication pathway.

Figure 7:
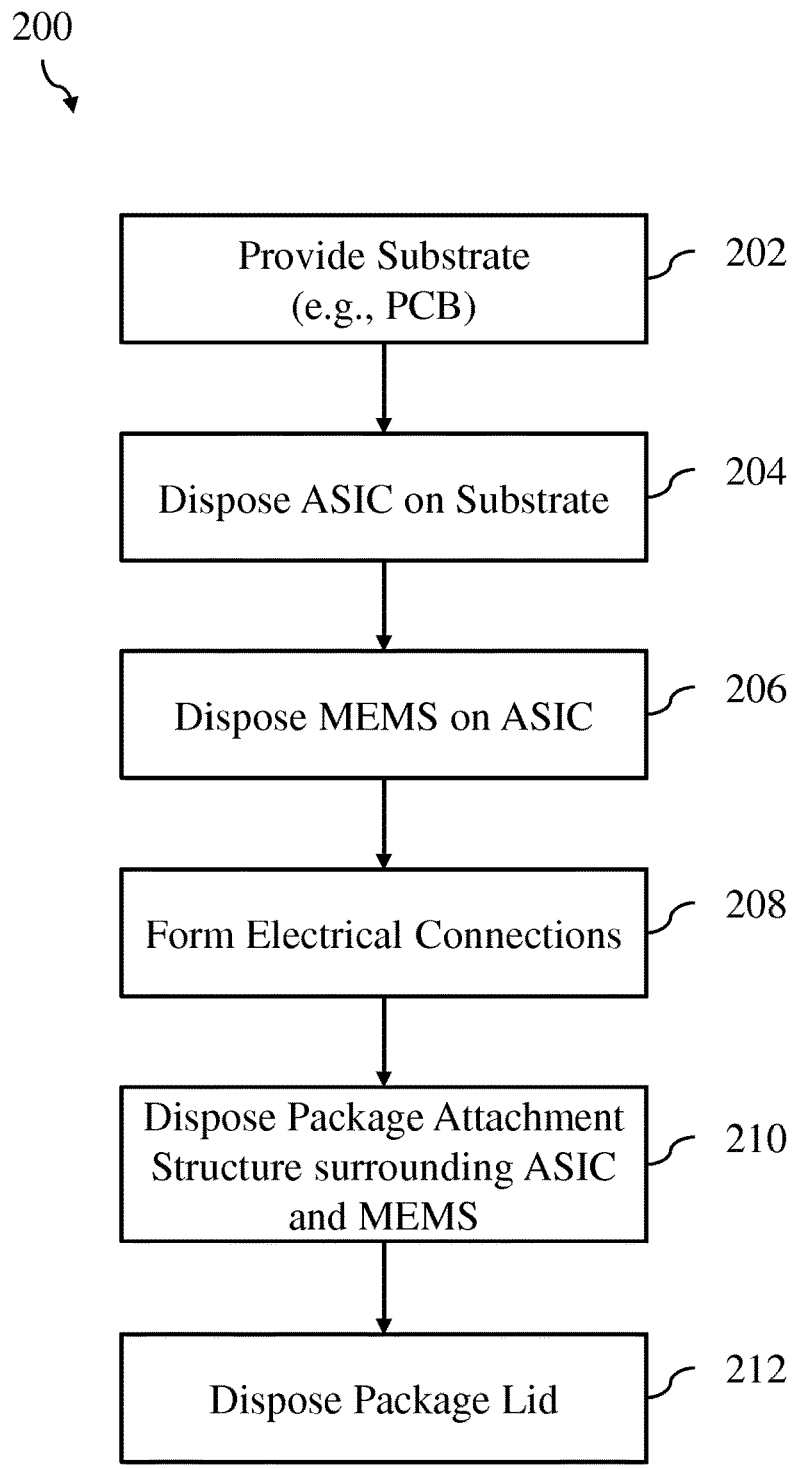
FIG. 7 illustrates a block diagram of an embodiment method of forming a packaged MEMS device.

FIG. 7 illustrates a block diagram of an embodiment method 200 of forming a packaged MEMS device including steps 202-212. According to various embodiments, method 200 may be implemented to form any of the packaged MEMS devices as described herein, such as packaged MEMS devices 100 or 120, for example. Step 202 includes providing a substrate. The substrate may include a structural material for attaching or forming components on. The substrate may include electrical properties. In some embodiments, the substrate is a circuit board. In a specific embodiment the substrate is a printed circuit board (PCB). In such embodiments, the PCB may be formed of materials including laminates, copper-clad laminates, resin impregnated cloth, and copper foil.

In various embodiments, step 204 includes disposing an integrated circuit (IC), such as an application specific integrated circuit (ASIC), on the substrate of step 202. In some specific embodiments, step 204 includes attaching an ASIC formed on a semiconductor die onto a PCB. Attaching the ASIC may include using glue or solder, for example. Step 206 includes disposing a MEMS die on the IC or ASIC of step 204. The MEMS die may be formed on an additional semiconductor die, glass substrate, or polymer substrate, for example, and attached to the semiconductor die including the ASIC of step 204. In various embodiments, the semiconductor die with the ASIC and the MEMS die may be attached using glue or solder, including an array of solder balls for example, or may be attached using flip-chip bonding. In other embodiments, the MEMS die may be disposed on the substrate of step 202 adjacent the ASIC of step 204 and not on the ASIC of step 204.

In various embodiments, step 208 includes forming electrical connections between the MEMS die of step 206, the ASIC of step 204, and any other components attached to the substrate or PCB of step 202. In specific embodiments, wire bonding may be used to electrically couple the ASIC of step 204 to the PCB and to electrically couple the MEMS of step 206 to the ASIC of step 204. The PCB of step 202 may include one or more electrical redistribution layers for electrical connections to other components (not shown) or further contact pads to other circuit boards, such as a main PCB in a mobile phone for example. Step 208 may include forming wire bonds between the ASIC of step 204 and the electrical connections within the PCB of step 202. In further embodiments, step 208 includes forming the electrical connections between the MEMS die of step 206 and the ASIC of step 204 through flip-chip bonding. For example, in one embodiment, step 208 may include forming a redistribution layer (RDL) and a ball grid array (BGA) between the ASIC and the MEMS. In various embodiments, steps 202, 204, 206, and 208 may be rearranged in a different sequence, include additional steps, or include overlapping or combined steps.

In various embodiments, step 210 includes disposing a package attachment structure surrounding the ASIC of step 204 and the MEMS die of step 206. The package attachment structure is for attaching a lid or cover. In various embodiments, disposing the package attachment structure includes forming attachment pads, such as attachment pads 126 as described in reference to FIGS. 2a and 2b. In such embodiments, disposing the package attachment structure also includes forming gaps, such as gaps 125 as described in reference to FIGS. 2a and 2b, between sections of the attachment structure, e.g., attachment pads. Forming the gaps may include selective deposition or patterning in some embodiments. In such embodiments, the attachment pads may be formed of different materials in different embodiments. In some embodiments, the attachment pads may be formed of metal, such as copper or gold. In other embodiments, the attachment pads may be formed of paint or lacquer. In some embodiments, soldering is used to attach a lid or cover to the PCB of step 202. In one embodiment, welding is used to attach the lid or cover to the PCB. In still another embodiment, glue or resin is used to attach the lid or cover to the PCB.

In further embodiments, disposing the package attachment structure may include forming mesh pads, such as mesh pads 152 as described in reference to FIGS. 4a and 4b. In various different embodiments, the package attachment structure may include any materials and or structures as described hereinabove in reference to attachment pads 126 or mesh pads 152 in FIGS. 2a, 2b, 4a, and 4b. Further, disposing the package attachment structure may include forming any type of port or opening as described hereinabove in reference to the other figures, such as in reference to gaps 125 or ventilation holes 142 in FIGS. 2a, 2b, 3a, and 3b. In still further embodiments, step 210 includes forming a support structure, such as support structure 164 as described in reference to FIG. 5, with a port or opening. The support structure may be formed of any of the materials described in reference to support structure 164 in FIG. 5 and includes a fluidic port or opening such as described in reference to port 166 in FIG. 5.

In various embodiments, step 212 includes forming a lid or cover on the package attachment structure of step 210. The lid or cover may be formed with the structure or materials of cover 124 as described in reference to FIGS. 2a and 2b. In various embodiments, method 200 may include additional steps and steps 202-212 may be rearranged in a different sequence of steps. Various modifications and additions to method 200 are envisioned suitable to specific applications and system requirements, as will be readily appreciated by those of skill in the art.

Figure 8:
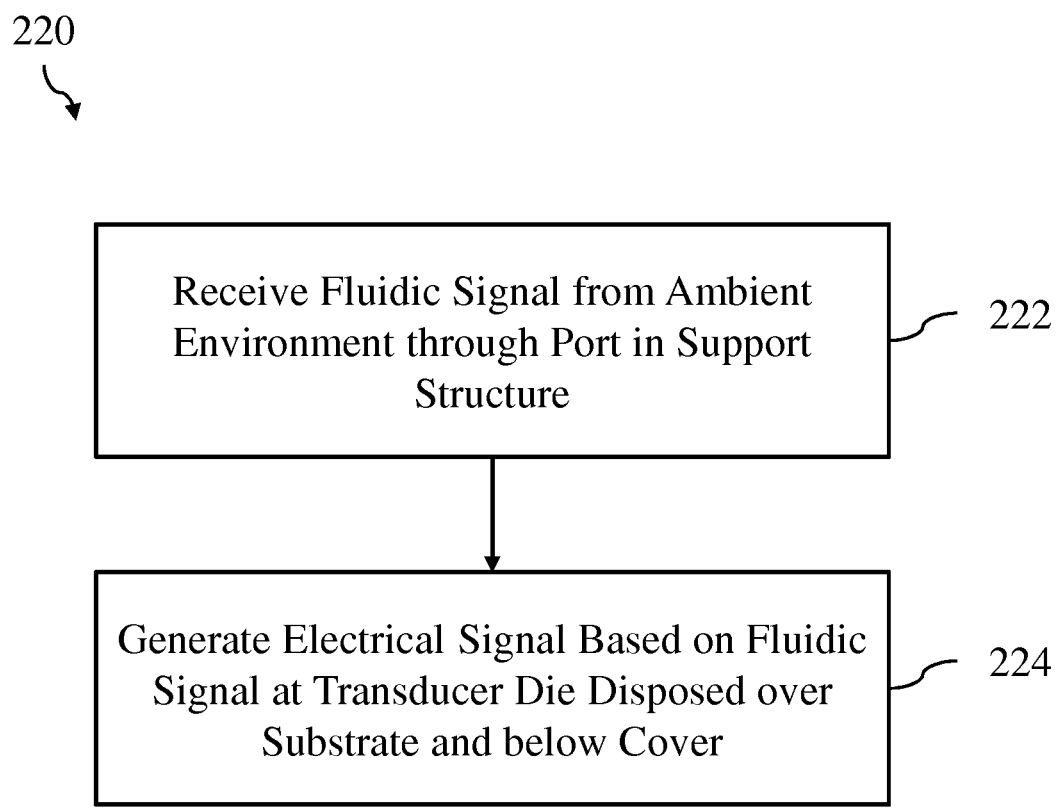
FIG. 8 illustrates a block diagram of an embodiment method of operation for a packaged MEMS device.

FIG. 8 illustrates a block diagram of an embodiment method of operation 220 for a packaged MEMS device including steps 222 and 224. According to various embodiments, step 222 includes receiving a fluidic signal from an ambient environment through a port in a support structure. In such embodiments, the support structure connects a cover of the packaged MEMS device to a substrate. In an embodiment, the substrate is a PCB. In various embodiments, step 224 includes generating an electrical signal based on the fluidic signal at a transducer die disposed over the substrate and below the cover. The transducer die may include a MEMS pressure transducer. In various embodiments, method of operation 220 may include additional steps and be rearranged according to a different sequence of steps.

According to an embodiment, a device includes a substrate, a transducer die disposed over the substrate, a cover disposed over the transducer die, and a support structure connecting the cover to the substrate. The support structure includes a port configured to allow transfer of fluidic signals between an ambient environment and the transducer die. Other embodiments include corresponding systems or apparatus, each configured to perform corresponding actions or methods.

In various embodiments, the support structure includes a plurality of attachment pads disposed on the substrate, and the port includes a plurality of gaps between the plurality of attachment pads. The plurality of attachment pads includes a plurality of metal attachment pads in some embodiments. The plurality of attachment pads includes a plurality of resin attachment pads in other embodiments. In some embodiments, each gap of the plurality of gaps includes a height between the substrate and the cover that is less than or equal to 100 µm.

In various embodiments, the port is gas permeable and liquid impermeable. The port may include a through hole. In some embodiments, the port includes a polymer that is gas permeable and liquid impermeable. The substrate includes a printed circuit board. The transducer die may include a MEMS pressure transducer. In some embodiments, the device further includes an integrated circuit die disposed over the substrate and below the cover. In such embodiments, the transducer die may be disposed on the integrated circuit die and electrically connected to the integrated circuit die. The device may further include an additional port in the substrate, where the additional port allows the transfer of fluidic signals between an ambient environment and the transducer die.

According to an embodiment, a method of operating a device includes receiving a fluidic signal from an ambient environment through a port in a support structure and generating an electrical signal based on the fluidic signal at a transducer die disposed over a substrate and below a cover. The support structure connects the cover to the substrate. Other embodiments include corresponding systems or apparatus, each configured to perform corresponding actions or methods.

In various embodiments, receiving a fluidic signal includes receiving a pressure signal from the ambient environment through the port. In such embodiments, generating an electrical signal may include generating an electrical signal based on the pressure signal using a capacitive MEMS pressure transducer disposed on the transducer die.

According to an embodiment, a method of forming a device includes disposing a transducer die over a substrate, disposing a support structure on the substrate, and disposing a cover on the support structure over the transducer die. The support structure includes a port configured to allow transfer of fluidic signals between an ambient environment and the transducer die. Other embodiments include corresponding systems or apparatus, each configured to perform corresponding actions or methods.

In various embodiments, the method further includes disposing an integrated circuit over the substrate and below the cover. Disposing a support structure on the substrate may include disposing a plurality of attachment pads on the substrate, where the plurality of attachment pads includes a plurality of gaps between the plurality of attachment pads, and where the plurality of gaps includes the port. In such embodiments, the method may further include disposing a waterproofing material in the plurality of gaps. The waterproofing material is gas permeable and liquid impermeable. In such embodiments, the waterproofing material may be a polymer. In some embodiments, disposing a transducer die includes disposing a MEMS pressure transducer over the substrate.

According to an embodiment, a MEMS pressure sensor includes a printed circuit board, an integrated circuit coupled to the printed circuit board, a MEMS pressure transducer coupled to the printed circuit board, a plurality of attachment pads disposed on the printed circuit board surrounding the MEMS pressure transducer and the integrated circuit, and a cover attached to the printed circuit board by the plurality of attachment pads. The plurality of attachment pads includes a plurality of gaps between each attachment pad, and the plurality of gaps includes openings between an ambient environment and the MEMS pressure transducer. Other embodiments include corresponding systems or apparatus, each configured to perform corresponding actions or methods.

In various embodiments, the MEMS pressure sensor further includes a through hole in the printed circuit board, where the through hole includes an additional opening between an ambient environment and the MEMS pressure transducer. In some embodiments, the MEMS pressure transducer is stacked on the integrated circuit.

According to various embodiments described herein, advantages may include increased protection from a cover for a packaged MEMS transducer. An additional advantage of the various embodiments may include a fluidic coupling to the ambient environment that is robust against contamination from particles such as dirt. A further advantage of the various embodiments may include a simple fabrication process for an improved transducer package without the addition of complex structures or involved processing steps.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A device comprising:
   a substrate;
   a transducer die disposed over the substrate;
   a cover disposed over the transducer die; and
   a support structure connecting the cover to the substrate, wherein the support structure comprises a port configured to allow transfer of fluidic signals between an ambient environment and the transducer die, wherein the support structure comprises a plurality of attach- ment pads disposed on the substrate, and the port comprises a plurality of gaps between the plurality of attachment pads.

2. The device of claim 1, wherein the plurality of attachment pads comprises a plurality of metal attachment pads.

3. The device of claim 1, wherein the plurality of attachment pads comprises a plurality of resin attachment pads.

4. The device of claim 1, wherein each gap of the plurality of gaps comprises a height between the substrate and the cover that is less than or equal to 100 μm.

5. The device of claim 1, wherein the port is gas permeable and liquid impermeable.

6. The device of claim 1, wherein the port comprises a through hole.

7. The device of claim 1, wherein the port comprises a polymer that is gas permeable and liquid impermeable.

8. The device of claim 1, wherein the substrate comprises a printed circuit board.

9. The device of claim 1, wherein the transducer die comprises a MEMS pressure transducer.

10. The device of claim 1, further comprising an integrated circuit die disposed over the substrate and below the cover.

11. The device of claim 10, wherein the transducer die is disposed on the integrated circuit die and electrically connected to the integrated circuit die.

12. The device of claim 1, further comprising an additional port in the substrate, the additional port configured to allow transfer of fluidic signals between an ambient environment and the transducer die.

13. A method of operating a device, the method comprising:
receiving a fluidic signal from an ambient environment through a port in a support structure, wherein the support structure connects a cover to a substrate, the support structure comprises a plurality of attachment pads disposed on the substrate, and the port comprises a plurality of gaps between the plurality of attachment pads; and
generating an electrical signal based on the fluidic signal at a transducer die disposed over the substrate and below the cover.

14. The method of claim 13, wherein receiving a fluidic signal comprises receiving a pressure signal from the ambient environment through the port.

15. The method of claim 14, wherein generating an electrical signal comprises generating an electrical signal based on the pressure signal using a capacitive MEMS pressure transducer disposed on the transducer die.

16. A method of forming a device, the method comprising:
disposing a transducer die over a substrate;
disposing a support structure on the substrate, wherein the support structure comprises a port configured to allow transfer of fluidic signals between an ambient environment and the transducer die, disposing the support structure on the substrate comprises disposing a plurality of attachment pads on the substrate, the plurality of attachment pads comprises a plurality of gaps between the plurality of attachment pads, and the plurality of gaps comprises the port; and
disposing a cover on the support structure over the transducer die.

17. The method of claim 16, further comprising disposing an integrated circuit over the substrate and below the cover.

18. The method of claim 16, further comprising disposing a waterproofing material in the plurality of gaps, wherein the waterproofing material is gas permeable and liquid impermeable.

19. The method of claim 18, wherein the waterproofing material is a polymer.

20. The method of claim 16, wherein disposing a transducer die comprises disposing a MEMS pressure transducer over the substrate.

21. A MEMS pressure sensor comprising:
a printed circuit board;
an integrated circuit coupled to the printed circuit board;
a MEMS pressure transducer coupled to the printed circuit board;
a plurality of attachment pads disposed on the printed circuit board surrounding the MEMS pressure transducer and the integrated circuit, the plurality of attachment pads comprising a plurality of gaps between each attachment pad; and
a cover attached to the printed circuit board by the plurality of attachment pads, wherein the plurality of gaps comprise openings between an ambient environment and the MEMS pressure transducer.

22. The MEMS pressure sensor of claim 21, further comprising a through hole in the printed circuit board, wherein the through hole comprises an additional opening between an ambient environment and the MEMS pressure transducer.

23. The MEMS pressure sensor of claim 21, wherein the MEMS pressure transducer is stacked on the integrated circuit.

* * * * *